United States Patent
Huang et al.

(10) Patent No.: US 6,844,622 B2
(45) Date of Patent: Jan. 18, 2005

(54) SEMICONDUCTOR PACKAGE WITH HEAT SINK

(75) Inventors: Chien-Ping Huang, Hsinchu (TW); Tzong-Da Ho, Taichung (TW); Cheng-Hsu Hsiao, Nantou (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/916,021

(22) Filed: Jul. 26, 2001

(65) Prior Publication Data

US 2002/0180035 A1 Dec. 5, 2002

(30) Foreign Application Priority Data

Jun. 4, 2001 (TW) ..................................... 90113448 A

(51) Int. Cl.⁷ ............................................. H01L 23/34
(52) U.S. Cl. ..................................................... 257/706
(58) Field of Search ............................... 257/706, 675, 257/720, 778, 787, 788, 796

(56) References Cited

U.S. PATENT DOCUMENTS

| | | | | | |
|---|---|---|---|---|---|
| 4,521,801 A | * | 6/1985 | Kato et al. | .................. | 257/748 |
| 4,528,613 A | * | 7/1985 | Stetson et al. | ............ | 361/321.5 |
| 4,848,646 A | * | 7/1989 | Morishita et al. | ........... | 228/206 |
| 5,471,366 A | | 11/1995 | Ozawa | ....................... | 361/704 |
| 5,622,590 A | * | 4/1997 | Kunitomo et al. | .......... | 156/291 |
| 5,726,079 A | | 3/1998 | Johnson | ...................... | 438/106 |
| 6,054,337 A | * | 4/2000 | Solberg | ....................... | 438/107 |
| 6,084,297 A | * | 7/2000 | Brooks et al. | ............... | 257/698 |
| 6,127,724 A | * | 10/2000 | DiStefano | .................... | 257/675 |
| 6,169,328 B1 | * | 1/2001 | Mitchell et al. | ............. | 257/778 |
| 6,198,171 B1 | * | 3/2001 | Huang et al. | ............... | 257/787 |
| 6,236,568 B1 | * | 5/2001 | Lai et al. | ..................... | 361/704 |
| 6,288,900 B1 | * | 9/2001 | Johnson et al. | ............. | 361/705 |
| 6,294,831 B1 | * | 9/2001 | Shishido et al. | ............. | 257/729 |
| 6,309,915 B1 | * | 10/2001 | Distefano | ..................... | 438/127 |
| 6,323,065 B1 | * | 11/2001 | Karnezos | ..................... | 438/122 |
| 6,326,687 B1 | * | 12/2001 | Corisis | ........................ | 257/713 |
| 6,326,700 B1 | * | 12/2001 | Bai et al. | ..................... | 257/790 |
| 6,340,842 B1 | * | 1/2002 | Nakamura | .................... | 257/724 |
| 6,404,070 B1 | * | 6/2002 | Higashi et al. | ............. | 257/796 |
| 6,486,562 B1 | * | 11/2002 | Kato | ............................ | 257/778 |
| 6,586,279 B1 | * | 7/2003 | Davidson et al. | ........... | 438/122 |

FOREIGN PATENT DOCUMENTS

JP          11284094 A   * 10/1999

* cited by examiner

Primary Examiner—Tom Thomas
Assistant Examiner—Chris C. Chu
(74) Attorney, Agent, or Firm—Peter F. Corless; Steven M. Jensen; Edwards & Angell, LLP

(57) ABSTRACT

A semiconductor package with a heat sink is proposed, in which a chip has its first surface attached to a chip carrier, while a second surface of the chip is attached to a heat sink through an adhesive, allowing heat generated by the chip to be transmitted to the heat sink. Moreover, in a molding process, a molding resin is used to form an encapsulant for encapsulating the chip, while a top surface and side surfaces connected to the top surface of the heat sink are exposed to outside of the encapsulant, that is, the heat sink merely has its bottom surface bonded to the encapsulant. This makes the generated heat directly dissipated to the atmosphere through the heat sink. Furthermore, the top surface of the heat sink is coated with an interface layer, while adhesion between the interface layer and the molding resin is smaller than that between the heat sink and the encapsulant. This allows the molding resin remained on the interface layer to be easily removed after completing the molding process, while delamination can be prevented from occurrence between the heat sink or the chip and the encapsulant, and also the chip can be prevented from cracking due to clamping force generated during molding.

12 Claims, 5 Drawing Sheets

US 6,844,622 B2

SEMICONDUCTOR PACKAGE WITH HEAT SINK

FIELD OF THE INVENTION

This invention relates to semiconductor packages, and more particularly, to a semiconductor package with a heat sink so as to improve the heat-dissipating efficiency.

BACKGROUND OF THE INVENTION

A conventional semiconductor package having a semiconductor chip encapsulated by an encapsulant is concerned with efficient dissipation of heat generated by the chip during operation, so as to assure the lifetime and quality of the semiconductor package.

However, as the encapsulant for enclosing the semiconductor chip is made of a molding compound e.g. epoxy resin that is poor in thermal conductivity, the heat generated by the chip is unable to be effectively dissipated through the encapsulant. Accordingly, a metallic heat sink or heat block is incorporated in the semiconductor package for improving the heat-dissipating efficiency. However, it is undesirable if the heat sink is entirely encapsulated by the encapsulant, in which the generated heat still needs to pass through the encapsulant for dissipation, limiting the improvement in the heat-dissipating efficiency. Therefore, it is preferable to construct a semiconductor package having a surface of the heat sink exposed to the atmosphere, allowing the generated heat to be directly dissipated through the exposed surface. Nevertheless, if the heat sink is not in direct contact with the chip, while the molding compound is filled in a space between the heat sink and the chip, the heat dissipation will be undesirably impeded due to the heat generated by the chip unable to be effectively transmitted to the heat sink.

Thus, U.S. Pat. Nos. 5,726,079 and 5,471,366 respectively disclose a semiconductor package illustrated in FIG. 8 The semiconductor package 1 has a heat sink 11 directly attached to a chip 10, while a top surface 110 of the heat sink 11 is exposed to the outside of an encapsulant 12 used for encapsulating the chip 10. With the direct contact between the chip 10 and the heat sink 11, and between the exposed top surface 110 of the heat sink 11 and the atmosphere, heat generated by the chip 10 can be directly transmitted to the heat sink 11 for dissipation without passing through the encapsulant 12. This makes the semiconductor package 1 have better heat-dissipating efficiency than the one as previously recited.

Nevertheless, some drawbacks have been found for the semiconductor package 1 in fabrication. First, while the chip 10 together with the heat sink 11 are placed in a mold cavity in a molding process, the top surface 110 of the heat sink 11 should closely abut a top wall of the mold cavity for preventing a molding resin from flashing on the top surface 110 of the heat sink 11. Alternatively, if there is a gap formed between the top surface 110 of heat sink 11 and the top wall of the mold cavity, resin flash occurs on the top surface 110 of the heat sink 11, making a fabricated product deteriorated in profile and in heat-dissipating efficiency, and subsequently a deflash process is definitely required. However, the flash process is undesirably time-consuming and cost-ineffective, even possibly causing damage to the fabricated product. On the other hand, if the heat sink 11 abuts the top wall of the mold cavity too closely, excessive clamping force from the mold cavity will crack the fragile chip 10 beneath the heat sink 11.

Furthermore, an adhesive or laminating tape used in the attachment of the heat sink 11 to the chip 10 is usually made of a thermosetting material, which remains soft before being heated for curing. This makes the structure of the chip 10 combined with the heat sink 11 not precisely controlled in height, thus inducing the foregoing problem of the top surface 110 of the heat sink 11 not appropriately abutting the top wall of the mold cavity. As a result, the fabricated product can not be assured in quality as well as not cost-effective in fabrication.

Furthermore, due to lack of preciseness in the height controlling as mentioned above, the attachment of the heat sink 11 to the chip 10 can not be accomplished in a batch-type manner in the molding process for the semiconductor package 1. That is, the heat sink 11 must be attached to its corresponding chip 10 one by one. This obviously increases the complexity and time consumption for the molding process.

In addition, the heat-dissipating efficiency of the semiconductor package 1 is proportional to the exposed surface area of the heat sink 11. That is, with the semiconductor package 1 remained constant in dimension, the heat sink 11 can be made to maximize the exposed surface area for providing optimal heat-dissipating efficiency. However, in the case of the heat sink is dimensioned to be identical in surface area to the semiconductor package, if the heat sink is not precisely made, the heat sink can not be placed into the mold cavity properly when the heat sink is over-sized, while resin flash tends to occur on the top surface and side surfaces of the heat sink when the heat sink is insufficiently dimensioned.

SUMMARY OF THE INVENTION

A primary objective of the present invention is to provide a semiconductor package with a heat sink, in which the heat sink is dimensioned to maximizing an exposed surface area thereof, so as to prevent resin flash from occurrence and improve the heat-dissipating efficiency. Moreover, the semiconductor package of the invention allows the heat sink to come in direct contact with a chip for further improving the heat-dissipating efficiency, and also prevents the chip from cracking in a molding process for assuring quality of the package. Furthermore, the invention can be implemented with the heat sink being attached to the chip in a batch-type manner in no concern with height controlling, which makes the overall fabrication simplified in process and reduced in cost. In addition, molds used for the semiconductor package of the invention can also be applied to various sized products, further reducing the fabrication cost.

In accordance with the above and other objectives, a semiconductor package with a heat sink is proposed in the present invention, including: a chip carrier; at least one chip mounted on the chip carrier and electrically connected to the chip carrier; a heat sink having a first surface, a second surface and a plurality of side surfaces interconnecting the first and second surfaces, wherein the first surface is attached to the chip for interposing the chip between the chip carrier and the heat sink and the second surface is formed with an interface layer thereon, while adhesion between the interface layer and a molding resin is smaller than that between the first surface of the heat sink and the molding resin; and an encapsulant made of the molding resin for encapsulating the chip and filling a gap between the first surface of the heat sink and the chip carrier, white the second surface and side surfaces of the heat sink are exposed to the outside of the encapsulant, and the side surfaces of the heat sink form a coplane with edge sides of the encapsulant.

The combined structure of the heat sink, the chip and the chip carrier has a height smaller than that of a mold cavity of molds used in a molding process, that is, the molding resin will encapsulate the interface layer of the heat sink during molding. As the interface layer has poor adhesion to the molding resin, the molding resin on the interface layer can be easily removed after forming the encapsulant, which will not lead to delamination between the heat sink and the encapsulant due to good adhesion therebetween. Furthermore, as the heat sink does not abut a top wall of the mold cavity, there is no concern for the chip to be cracked during molding. In addition, due to certain extent in flexibility for the height of the above combined structure, the molds can be applied to semiconductor packages varied in height.

The interface layer of the heat sink can be made of a metallic material having poor adhesion to the molding resin, such as gold, chromium, nickel, alloy thereon or Teflon, making the heat dissipation through the heat sink not undesirably affected by the interface layer.

In a preferred embodiment of the invention, the chip carrier is a BOA (ball grid array) substrate, in which at least one hole is formed on the substrate, allowing bonding wires to pass through the hole for electrically connecting the substrate to the chip. On a surface of the substrate opposing a surface for mounting the chip thereon there are implanted a plurality of solder balls, which are used to electrically connect the chip to an external device.

In another preferred embodiment of the invention, the chip carrier is a flip chip substrate, that is, on an upper surface of the substrate there are formed a plurality of array-arranged solder pads for bonding a plurality of solder bumps thereto, while the solder bumps are used to electrically connect the chip to the substrate. Moreover, on a lower surface of the substrate there are implanted a plurality of solder balls for electrically connecting the chip to an external device.

In a further preferred embodiment of the invention, the chip carrier is a QFN (quad flat nonlead) lead frame or a BGA substrate, which has an upper surface for mounting the chip thereon and is connected to the chip through a plurality of bonding wires. In order to prevent the bonding wires from being damaged by the attachment of the heat sink to the chip, on the first surface of the heat sink there is formed a connecting portion extending toward the chip at a position corresponding to the chip. This allows the heat sink to be connected to the chip through the connecting portion without contacting the bonding wires.

In a further preferred embodiment of the invention, the chip carrier is a QFN lead frame or a BGA substrate, which has an upper surface for mounting the chip thereon and is connected to the chip through a plurality of bonding wires. In order to prevent the bonding wires from being damaged by the attachment of the heat sink to the chip, as well as reduce a thermal stress generated from the heat sink to the chip due to the difference in CTE (coefficient of thermal expansion) between the heat sink and the chip, a buffer pad having a similar CTE to that of the chip can be interposed between the heat sink and the chip. The buffer pad is preferable a defective die for optimizing the reduction in the thermal stress.

In addition, the first surface of the heat sink can be roughened, corrugated or made uneven so as to enhance the bonding strength between the heat sink and the encapsulant.

BRIEF DESCRIPTION OF THE DRAWINGS

The invention can be more filly understood by reading the following detailed description of the preferred embodiments, with reference made to the accompanying drawings, wherein.

DETAILED DESCRIPTION OF THE PREFERRED EMBODIMENT

First Preferred Embodiment

Figure 1:
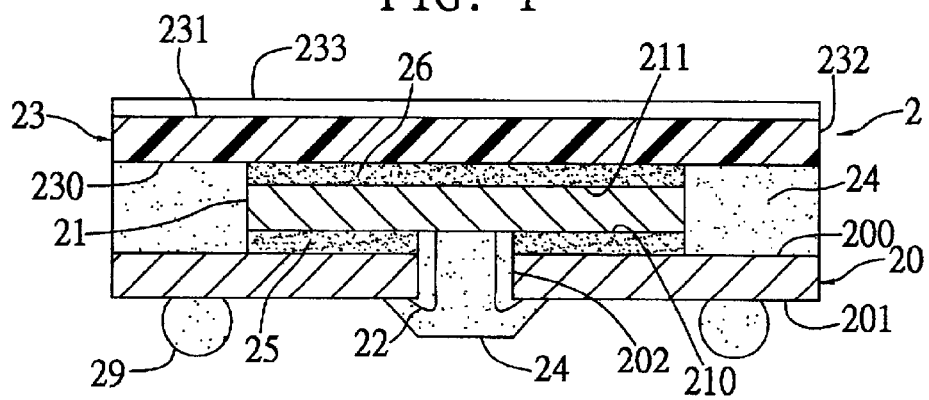
FIG. 1 is a sectional view of the first preferred embodiment of the semiconductor package of the invention.

As shown in FIG. 1, a semiconductor package 2 of the first embodiment of the invention includes a substrate 20; a chip 21 mounted on the substrate 20; a plurality of gold wires 22 for electrically connecting the substrate 20 to the chip 21; a heat sink 23 attached to the chip 21; and an encapsulant 24 for encapsulating the chip 21 and gold wires 22.

The substrate 20 has an upper surface 200, a lower surface 201 opposing the upper surface 200, and a hole 202 penetrating the substrate 20. On the lower surface 201 of the substrate 20 there are formed a plurality of conductive traces (not shown), which are connected to the chip 21 by means of the gold wires 22 passing through the hole 202 for electrically connecting the substrate 20 to the chip 21. The chip 21 has an active surface 210 and an opposing inactive surface 211. The active surface 210 is attached to the upper surface 200 of the substrate 20 through an adhesive 25 such as silver paste, while a plurality of bond pads (not shown) formed on the active surface 210 for bonding the gold wires 22 thereto are positioned corresponding to the hole 202. It is to be noted that when the bond pads are formed on the active surface 210 proximate to side edges thereof, at least two holes 202 must be provided.

The heat sink 23 has a first surface 230, a second surface 231 opposing the first surface 230, and a plurality of side faces 232 interconnecting the first surface 230 and the second surface 231. The second surface 231 is coated with a gold layer 233 thereon, while adhesion between the gold layer 233 and a molding resin used for forming the encapsulant 24 is smaller than that between the first surface 230 of the heat sink 23 and the molding resin. The first surface 230 is attached to the inactive surface 211 of the chip 21 through a thermally conductive adhesive 26, allowing heat generated by the chip 21 to be directly transmitted to the heat sink 23 without passing through the encapsulant 24. Moreover, after the encapsulant is formed, the heat sink 23 merely has the first surface 230 thereof bonded to the encapsulant 24, while the side faces 232 and the gold layer 233 coated on the second surface 231 of the heat sink 23 are exposed to the outside of the encapsulant 24. That is, the encapsulant 24 fills a gap between the first surface 230 of the heat sink 23 and the upper surface 200 of the substrate 20. Additionally, while the heat sink 23 has the same surface area as the substrate 20, the exposed surface area of the heat sink 23 can be maximized so as to effectively improve the heat-dissipating efficiency.

Furthermore, on the lower surface 201 of the substrate 20 there are implanted a plurality of solder balls 29 for electrically connecting the chip 21 to an external device.

Figure 2A:
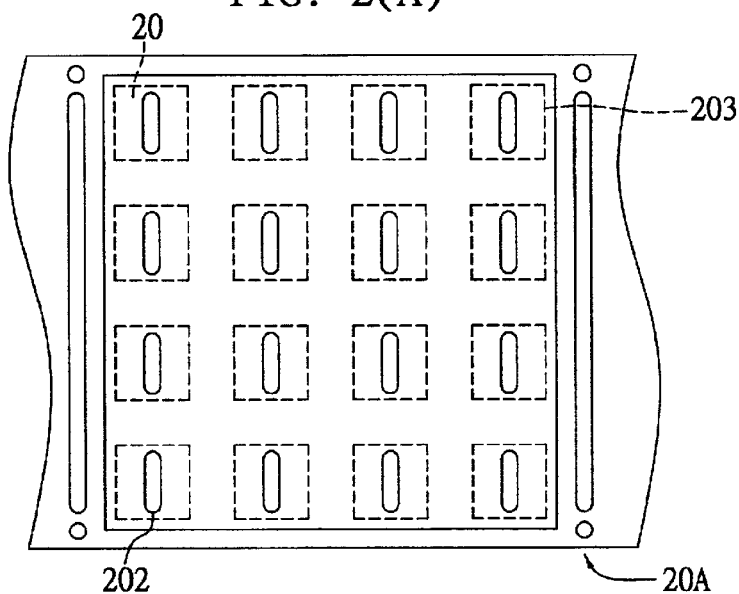
FIGS. 2(A)–2(H) are schematic diagrams showing the steps involved in fabricating the first preferred embodiment of the semiconductor package of the invention.

The semiconductor package 2 is fabricated by the steps shown in FIGS. 2(A)–2(H). Referring first to FIG. 2(A), a matrix type substrate module plate 20A is prepared, which consists of 16 substrates 20 arranged in 4×4 array, and each substrate 20 is formed with a hole 202 penetrating therethrough.

Figure 2B:
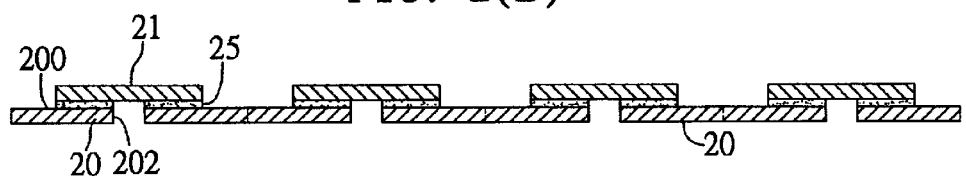

Referring next to FIG. 2(B), to a predetermined position on an upper surface 200 of each substrate 20 there is attached a chip 21 through an adhesive 25, while the chip 21 covers one end of the hole 202.

Figure 2C:
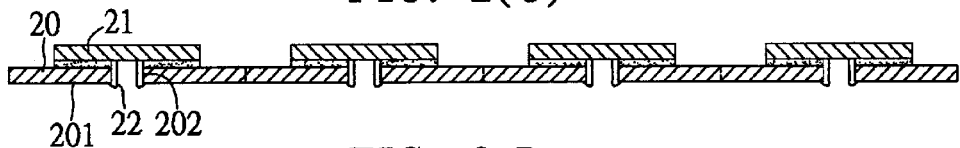

Referring further to FIG. 2(C), a plurality of gold wires 22 passing through the hole 202 are bonded to the chip 21 and a lower surface 201 of the substrate 20 for electrically connecting the chip 21 to the substrate 20. As the wire bonding employs a conventional process, it will not be further described herewith.

Figure 2D:
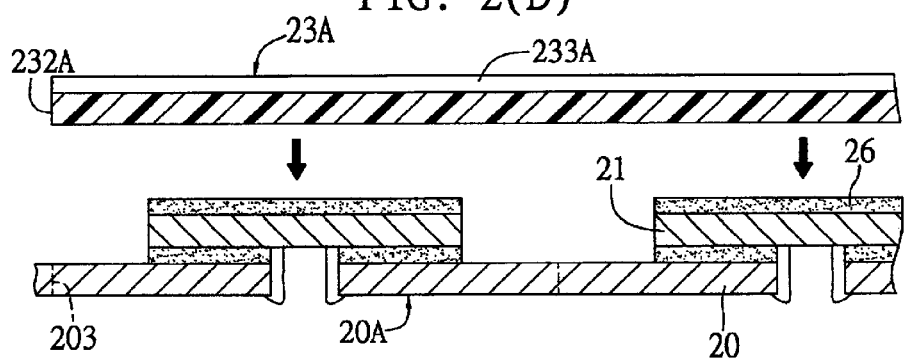

Referring further to FIG. 2(D), after the chip 21 is electrically connected to the substrate 20, a heat sink module plate 23A is attached to the chips 21 respectively through a conventional adhesive 26 (or a tape), while the heat sink module plate 23A is made of a metallic material such as copper, aluminum, copper alloy or aluminum alloy. The heat sink module plate 23A is sufficiently dimensioned for covering the substrates 20 having the chips 21 mounted thereon. That is, an area defined by side edges 232A of the module plate 23A is sufficient to encompass all side edges 203 (shown as dotted lines in FIG. 2(A)) of the substrates 20. Further, a top surface of the module plate 23A is coated with a gold layer 233A. The structure of combining the heat sink module plate 23A, the chips 21 and the substrate module plate 20A is dimensioned for the gold layer 233A not contacting a top wall of a mold cavity of molds (not shown) but rather be properly spaced from the top wall, when the combined structure is placed in the mold cavity. Besides gold, the coated layer on the heat sink module plate 23A can be formed of chromium, nickel, alloy thereof or Teflon; while adhesion between the coated layer and a molding resin used for encapsulating the chips 21 has to be smaller than that between a bottom surface of the module plate 23A and the molding resin.

Figure 2E:
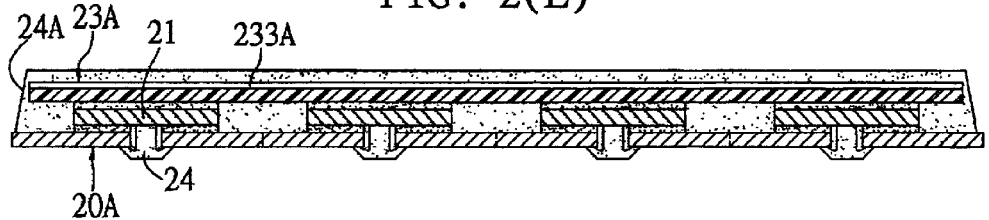

Referring further to FIG. 2(E), the combined structure of the heat sink module plate 23A, the chips 21 and the substrate module plate 20A is placed in the mold cavity of the molds for performing a molding process, which is used to form an encapsulant 24 for encapsulating the heat sink module plate 23A, the chips 21, the gold wires 22 and the substrate module plate 20A. As the combined structure is dimensioned for the gold layer 233A on the heat sink module plate 23A to be properly spaced from the top wall of the mold cavity, after the engagement of the molds, no cracks caused by clamping force from the molds or the heat sink module plate 23 will be generated for the chips 21. Further, as there is no concern for precisely controlling the height of the attachment of the heat sink module plate 23A to the chips 21, quality and reliability of the fabricated product can be assured.

Figure 2F:
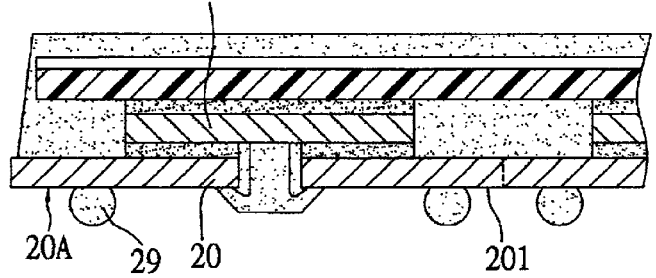

Referring to FIG. 2(F), after completing the mold process, on the lower surface 201 of each substrate 20 of the substrate module plate 20A there are implanted a plurality of solder balls 29 for electrically connecting the chips 21 to external devices. As the solder ball implantation employs a conventional process, it will not be further described herewith.

Figure 2G:
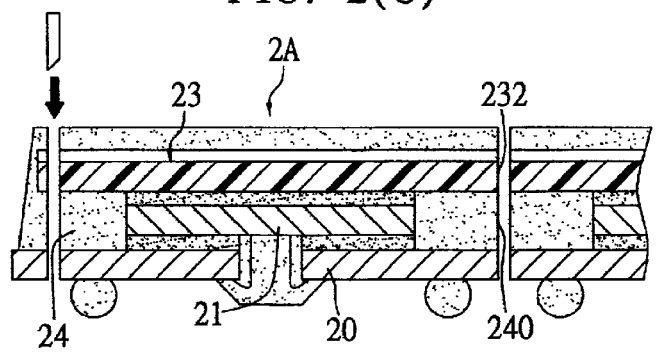

Referring to FIG. 2(G), a singulation process is performed by using a cutting machine for forming 16 semi-fabricated semiconductor packages 2A. The semi-fabricated package 2A has the side surfaces 232 of the heat sink 23 exposed to the outside of the encapsulant 24 and aligned with side surfaces 240 of the encapsulant 24. This makes no resin flash occur on the side surfaces 232 of the heat sink 23, while the heat sink 23 has the same surface area as the substrate 20, as well as no concern is required for the heat sink 23 to exactly match the mold cavity in dimension. Furthermore, since the attachment of the heat sink 23 to the chip 21 is accomplished in a batch type manner, the fabrication process can be simplified and more cost-effective as well as the fabrication time can be reduced.

Figure 2H:
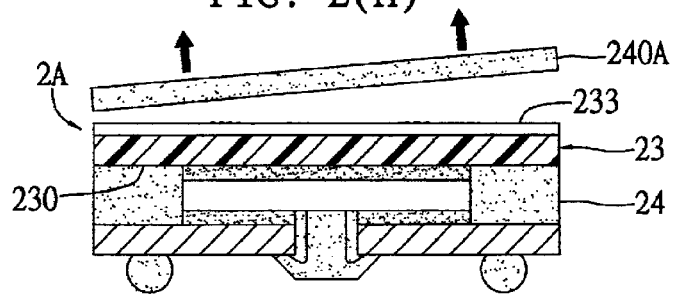

Referring finally to FIG. 2(H), the singulated semi-fabricated package 2A is heated for the remained molding resin 240A on the gold layer 233 to be delaminated from the gold layer 233, due to difference in thermal expansion coefficient between the molding resin used for forming the encapsulant 24 and the gold layer 233. It is required for the heating to be controlled in the condition of no delamination occurring between the first layer 230 of the heat sink 23 and the encapsulant 24. This allows the remaining molding resin 240A to be easily removed from the gold layer 233 without damaging the bonding of the heat sink 23 to the encapsulant 24. Further, since the remaining molding resin 240A can be completely removed from the gold layer 233, a subsequent deflash process is not necessary, which not only reduces the molding cost but also assures quality of the fabricated semiconductor package 2 (as shown in FIG. 1).

Second Preferred Embodiment

Figure 3:
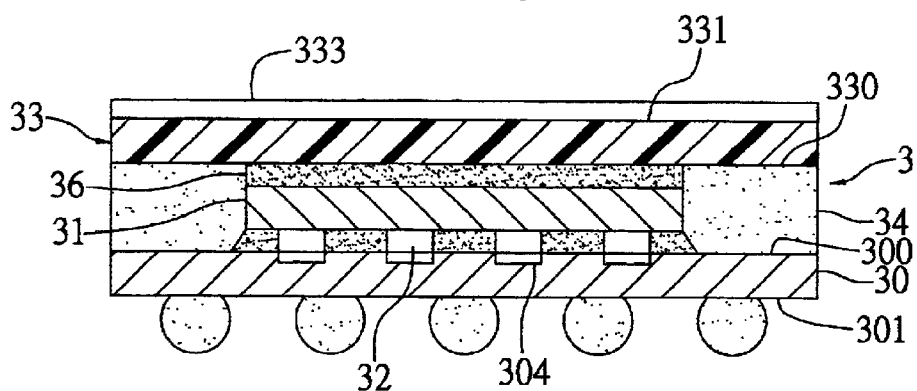
FIG. 3 is a sectional view of the second preferred embodiment of the semiconductor package of the invention.

Illustrated in FIG. 3 is the second embodiment of the semiconductor package of the invention. The semiconductor package 3 includes a flip chip substrate 30, wherein a plurality of bump pads 304 are formed at predetermined positioned on an upper surface 300 of the substrate 30, and a plurality of conductive traces (not shown) are formed on the upper surface 300 and an opposing lower surface 301 of the substrate 30 respectively. Then, a plurality of solder lumps 32 are bonded to the bump pads 304 for electrically connecting a chip 31 to the substrate 30 in a flip chip manner through the solder bumps 32. The chip 31 is attached to a first surface 330 of a heat sink 33 through an adhesive 36, allowing heat generated by the chip 31 to be directly transmitted to the heat sink 33. Further, on a second surface 331 opposing the first surface 330 of the heat sink 33 there is coated a gold layer 333, which with a molding resin has adhesion therebetween smaller than that between the first surface 330 of the heat sink 33 and the molding resin, while the molding resin is used to form an encapsulant 34 for encapsulating the chip 31. This is to make the remained molding resin (not shown) on the gold layer 333 be easily removed after completing a molding process for forming the encapsulant 34. Moreover, as the gold layer 333 is properly spaced from a top wall of a mold cavity used in the molding process, the chip 31 and the solder bumps 32 can be assured in quality without being damaged by clamping force. In addition, the heat sink 33 is still exposed to the outside of the encapsulant 34, making the heat-dissipating efficiency definitely increased.

Third Preferred Embodiment

Figure 4:
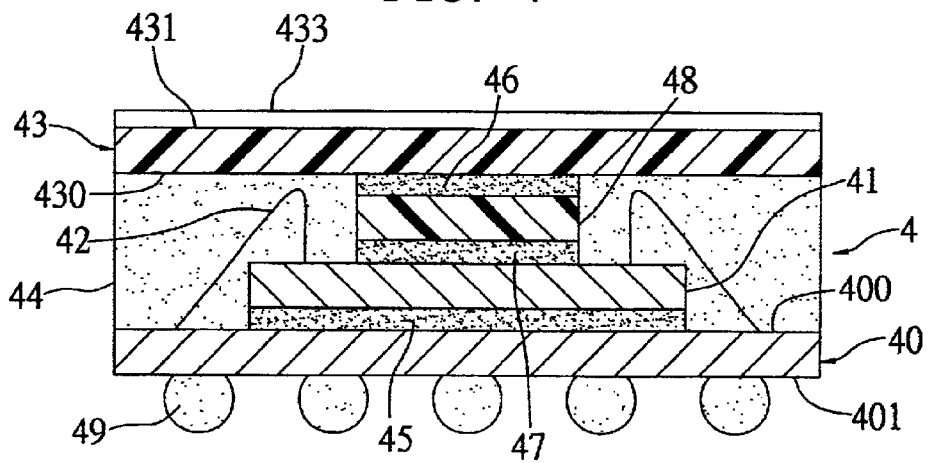
FIG. 4 is a sectional view of the third preferred embodiment of the semiconductor package of the invention.

Illustrated in FIG. 4 is the third embodiment of the semiconductor package of the invention. The semiconductor package 4 adopts a conventional BGA substrate 40 having an upper surface 400 and a lower surface 401 respectively formed with a plurality of conductive traces (not shown), while the conductive traces on the surfaces 400 and 401 are electrically connected to each other. A chip 41 is attached to the upper surface 400 of the substrate 40 through an adhesive 45 such as silver paste, and then electrically connected to the substrate 40 through a plurality of gold wires 42. Subsequently, a buffer pad 48 is attached through an adhesive 47 to an approximately central position of a surface of the chip 41 having the gold wires 42 bonded thereto. The buffer pad 48 has a similar thermal expansion coefficient to the chip 41 and is dimensioned for not interfering the gold wires 42. Further, the buffer pad 48 is constructed to be higher than arcs of the gold wires 42, so as to prevent a first surface 430 of a heat sink 43 from contacting the gold wires 42 when attaching the heat sink 43 to the buffer pad 48 through an adhesive 46. Moreover, the buffer pad 48 helps release a thermal stress generated from the heat sink 43 to the chip 41 at a high temperature due to difference in thermal expansion coefficient. This makes the chip 41 not be damaged by the thermal stress, and also allows heat generated by the chip 41 to be transmitted to the heat sink 43 through the buffer pad 48, while the heat is then dissipated into the atmosphere through a surface of the heat sink 43 exposed to the outside of an encapsulant 44, which encapsulates the chip 41 and the buffer pad 48. Furthermore, a second surface 431 of the heat sink 43 is also coated with a gold layer 433. In addition, the lower surface 401 of the substrate 40 is implanted with a plurality of solder balls 49 thereon through a conventional implantation process, so as to electrically connect the chip 41 to an external device.

Fourth Preferred Embodiment

Figure 5:
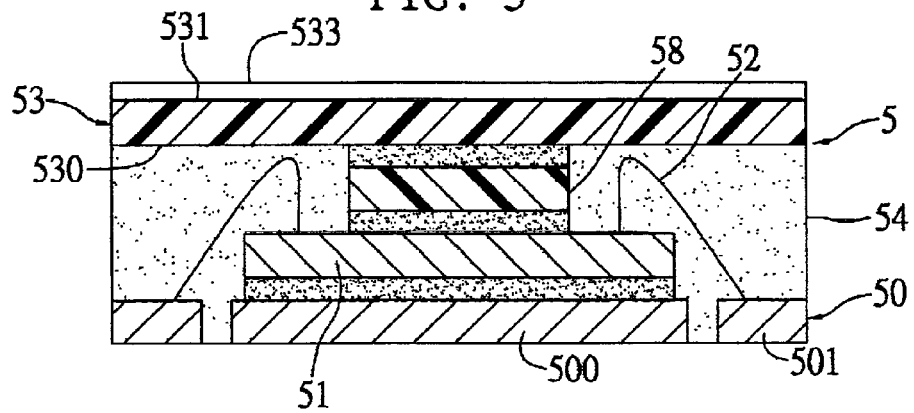
FIG. 5 is a sectional view of the fourth preferred embodiment of the semiconductor package of the invention.

Illustrated in FIG. 5 is a sectional view of the fourth embodiment of the semiconductor package of the invention. The semiconductor package 5 of the fourth embodiment is structurally similar to that depicted in the third embodiment, with the only difference in that the semiconductor package 5 employs a QFN lead frame 50 as a chip carrier for a chip 51. The QFN lead frame includes a die pad 500 and a plurality of leads 501. The die pad 500 is attached to the chip 51, which is then electrically connected to the leads 501 through gold wires 52. Further, on the chip 51 there is disposed a buffer pad 58, which is used to attach a heat sink 53 thereto, while the buffer pad 58 is interposed between the chip 51 and the heat sink 53. The heat sink 53 has a first surface 530 thereof made to be free of contact with the gold wires 52, while a second surface 531 of the heat sink 53 is also coated with a gold layer 533. Moreover, an encapsulant 54 is formed between the first surface 530 of the heat sink 53 and the QFN lead frame 50 for encapsulating the chip 51 and the buffer pad 58, while bottom surfaces of the die pad 500 and the leads 501 are exposed to the outside of the encapsulant 54.

Fifth Preferred Embodiment

Figure 6:
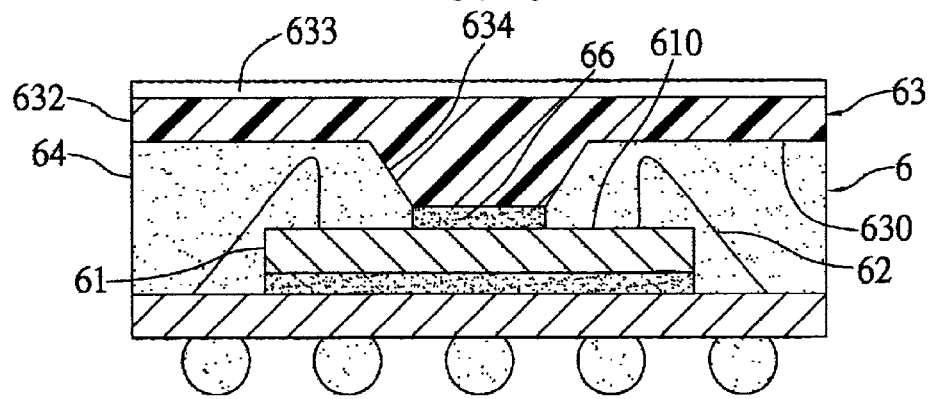
FIG. 6 is a sectional view of the fifth preferred embodiment of the semiconductor package of the invention.

Illustrated in FIG. 6 is a sectional view of the fifth embodiment of the semiconductor package of the invention. The semiconductor package 6 of the fifth embodiment is structurally similar to that depicted in the third embodiment, with the only difference in a heat sink 63 used in the semiconductor package 6. The heat sink 63 has a first surface 630 formed with a connecting portion 634 protruding toward a chip 61, while the connecting portion 634 is directly attached to an active surface 610 of the chip 61 through an adhesive 66. This allows heat generated by the chip 61 to be transmitted directly to the heat sink 63, and then to be dissipated through a coated gold layer 633 and side surfaces 632 of the heat sink 63 to the atmosphere for raising the heat-dissipating efficiency, while the gold layer 633 and the side surfaces 632 are exposed to the outside of an encapsulant 64 encapsulating the chip 61. Moreover, the connecting portion 634 is dimensioned for the first surface 630 of the heat sink 63 to be properly spaced from arcs of the gold wires 62 without contacting the gold wires 62.

Sixth Preferred Embodiment

Figure 7:
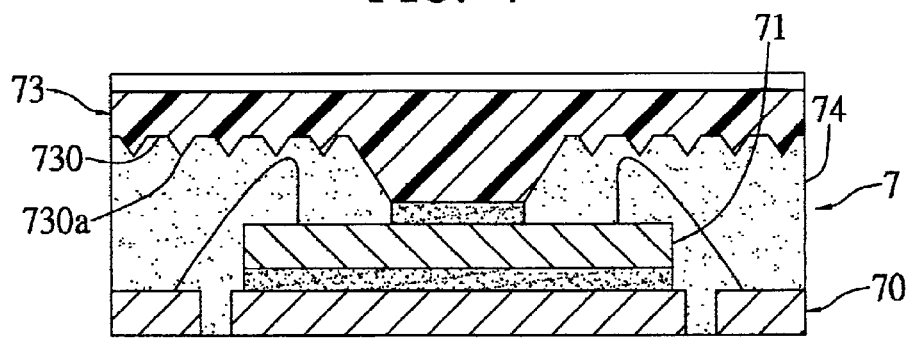
FIG. 7 is a sectional view of the sixth preferred embodiment of the semiconductor package of the invention.
Figure 8:
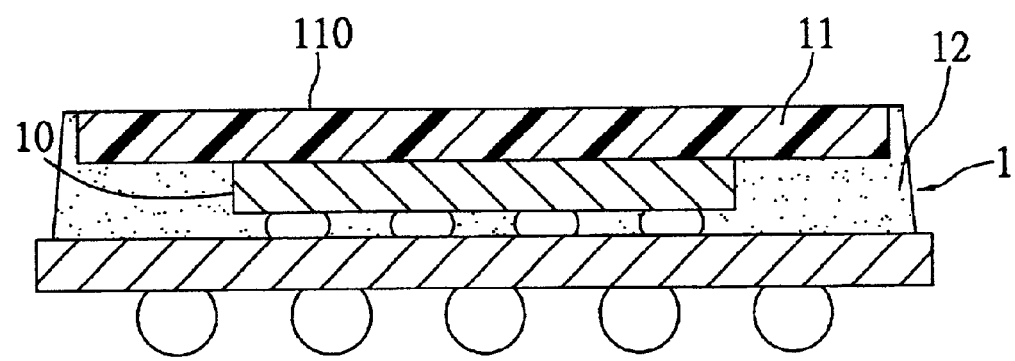
FIG. 8 (PRIOR ART) is a sectional view of a conventional semiconductor package with a heat sink.

Illustrated in FIG. 7 is a sectional view of the sixth embodiment of the semiconductor package of the invention. The semiconductor package 7 of the sixth embodiment is structurally similar to that depicted in the fourth embodiment, with the only difference in a heat sink 73 used in the semiconductor package 7. The heat sink 73 has a first surface 730 formed with a plurality of protrusions 730a, which are used to increase the contact area between the first surface 730 and an encapsulant 74 for enhancing the bonding strength between the heat sink 73 and the encapsulant 74, while the encapsulant 74 is used to encapsulate a chip 71 mounted on a QFN lead frame 70.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with a heat sink, comprising:
   a chip carrier;
   at least one chip mounted on a surface of the chip carrier and electrically connected to the chip carrier;
   a heat sink having a first surface, a second surface opposing the first surface, and a plurality of side surfaces interconnecting the first surface and the second surface, wherein the first surface of the heat sink is attached to the chip for interposing the chip between the chip carrier and the heat sink;
   an interface layer formed on the second surface of the heat sink, and made of a material having adhesion with a molding compound smaller than adhesion between the heat sink and the molding compound, wherein the interface layer covers the entire second surface of the heat sink; and
   an encapsulant made of the molding compound for encapsulating the chip, tho heat sink and the chip carrier, wherein the interface layer and the side surfaces of the heat sink are exposed to outside of the encapsulant, the side surfaces of the heat sink are flush with side edges of the encapsulant, and the molding compound left on the interface layer during formation of the encapsulant is easily and thermally removable from the interface layer, so as to make the semiconductor package free of flash of the molding compound because of the relatively smaller adhesion between the interface layer and the molding compound and a difference in thermal expansion coefficient between the interface layer and the molding compound.

2. The semiconductor package of claim 1, wherein the heat sink has a surface area dimensionally same as that of the chip carrier.

3. The semiconductor package of claim 1, wherein the material for making interface layer on the second surface of the heat sink is selected from the group consisting of gold, chromium, nickel alloy thereof and Teflon (polytetrafluoroethylene).

4. The semiconductor package of claim 1, wherein the chip carrier is a substrate.

5. The semiconductor package of claim 4, wherein the chip is electrically connected to the substrate through bonding wires.

6. The semiconductor package of claim 4, wherein the chip is electrically connected to the substrate through solder bumps.

7. The semiconductor package of claim 1, wherein the chip carrier is a QFN (quad flat nonlead) lead frame.

8. The semiconductor package of claim 7, wherein the chip is electrically connected to the QFN lead frame through bonding wires.

9. The semiconductor package of claim 1, wherein the first surface of the heat sink is roughened, corrugated or made uneven.

10. The semiconductor package of claim 1, wherein at a position on the first surface of the heat sink corresponding to the chip there is formed a connecting portion extending toward the chip for connecting the heat sink to the chip through the connecting portion, and the first surface of the heat sink other than the position of the connecting portion is spaced from the chip.

11. The semiconductor package of claim 1, wherein a buffer pad is interposed between the chip and the heat sink, and made of a material having a similar thermal expansion coefficient to the chip.

12. The semiconductor package of claim 1, further comprising a plurality of solder balls implanted on a surface of the chip carrier opposite to the surface mounted with the chip.

* * * * *